United States Patent [19]

Yamamoto

[11] Patent Number: 4,649,290

[45] Date of Patent: Mar. 10, 1987

[54] PULSE GENERATING CIRCUIT

[75] Inventor: Makoto Yamamoto, Hyogo, Japan

[73] Assignee: Mitsubishi Denki Kabushiki Kaisha, Tokyo, Japan

[21] Appl. No.: 765,789

[22] Filed: Aug. 15, 1985

[30] Foreign Application Priority Data

Sep. 29, 1984 [JP] Japan .................. 59-205025

[51] Int. Cl.$^4$ ............. H03K 3/353; H03K 5/13
[52] U.S. Cl. .................. 307/260; 307/268; 307/581; 307/450; 307/304
[58] Field of Search ............ 307/571, 574, 575, 577, 307/581, 584, 448, 450, 468, 260, 261, 262, 268, 304, 241, 243, 234, 446

[56] References Cited

U.S. PATENT DOCUMENTS 4,464,581 8/1984 Oritani .................. 307/571
4,595,845 6/1986 Briggs .................. 307/450

FOREIGN PATENT DOCUMENTS 2061443 6/1972 Fed. Rep. of Germany .
0208943 11/1984 Japan .................. 307/448

OTHER PUBLICATIONS

IBM Technical Disclosure Bulletin, vol. 18, No. 3, pp. 910–911 (Aug. 1979).
Radio Fernsehen Electronik, Bd. 31, 1982, p. 367.
Tietze, Schenk, Halbleiter-Schaltungstechnik, Springer-Verlag 1983, pp. 83–84.

Primary Examiner—Stanley D. Miller
Assistant Examiner—Trong Quang Phan
Attorney, Agent, or Firm—Sughrue, Mion, Zinn, Macpeak & Seas

[57] ABSTRACT

A pulse generating circuit composed of MOS IGFETs formed on a semiconductor substrate. The circuit includes first and second input circuits, each composed of an enhancement/depletion transistor pair, with the drains of each pair coupled in common to a respective one of two input terminals receiving complementary input signals. The channel resistance in the on state of the depletion-type transistors is made to be significantly higher than the channel resistance of the enhancement-type transistors in the on state. An output circuit is provided composed of a depletion-type transistor and two enhancement-type transistors connected in a NOR gate configuration. The gates of the two enhancement-type transistors of the output circuit are connected to source nodes of respective ones of the input circuits, to each of which both sources and gates of the two transistors of the respective circuit are connected.

6 Claims, 4 Drawing Figures

PULSE GENERATING CIRCUIT

BACKGROUND OF THE INVENTION

The present invention relates to a pulse generating circuit composed of MOS IGFETs (metal-oxide-semiconductor field-effect transistors).

A conventional circuit of the same general type to which the invention pertains is shown in FIG. 1. In this figure, transistors $Q_1$, $Q_3$, $Q_5$, $Q_7$ and $Q_{10}$ are depletion-type devices, while transistors $Q_2$, $Q_4$, $Q_6$, $Q_8$ $Q_9$, $Q_{11}$, $Q_{12}$, and $Q_{13}$ are enhancement-type devices. Transistors $Q_1$ through $Q_6$ are connected in the configuration of a three-stage inverter, the transistors $Q_7$, $Q_8$, and $Q_9$ in a NOR circuit, the transistors $Q_{12}$ and $Q_{13}$ in a NAND circuit, and the transistors $Q_{10}$, $Q_{11}$ and $Q_{12}$ in a second NOR circuit.

In operation, with reference also to the timing chart of FIG. 2, the input signal A is delayed and inverted by the inverter circuit composed of the transistors $Q_1$ through $Q_6$ to produce a signal B, which is delayed and inverted with respect to the signal A. By forming the NOR of the signals A and B, a pulse signal C is produced. Further, by forming the NAND of the signals A and B with the NAND gate formed of the transistors $Q_{12}$ and $Q_{13}$, low-going pulses are produced at times between the pulses of the signal C. By forming the NOR of the signal C with the NAND product of the signals A and B using the transistors $Q_{12}$ and $Q_{13}$, an output signal D is produced as shown in FIG. 2.

To change the pulse width of the signal D, the number of stages of the inverter circuit can be changed (so long as an odd number of stages is maintained).

Although the circuit of FIG. 1 is capable of producing an output pulse signal as desired, nevertheless, it is disadvantageous in that its implementation requires more transistor devices than is desirable. Accordingly, its overall power consumption is higher than is desirable, and also the chip area required for the circuit is large. Another disadvantage is that the circuit layout must be changed to vary to pulse period.

SUMMARY OF THE INVENTION

Accordingly, it is an object of the present invention to provide a pulse generating circuit which requires a fewer number of transistor devices in its implementation and accordingly requires less circuit area and has a smaller power consumption than the abovedescribed conventional circuit.

It is a further object of the present invention to provide such pulse generating circuit for which the pulse period can easily be varied without changing the number of transistor devices in the circuit.

These, as well as the other objects of the invention, are met by a pulse generating circuit comprising an input circuit comprising at least one enhancement/depletion transistor pair, and an output circuit receiving the output of the input circuit. In the input circuit, each enhancement/depletion transistor pair includes enhancement and depletion transistors having drains coupled together and sources coupled together, with the gates of both transistors coupled to the source node. In the output circuit, an output transistor has a gate connected to the source node of the input circuit.

In a preferred embodiment of the invention, a pulse generating circuit is provided including two input circuits, each comprising an enhancement/depletion transistor pair. Within each pair, the drains of the two transistors are connected together, as are these sources, and the gates of the two transistors are connected to the source node. The commonly connected drains of one of the pairs receives the input signal, while the commonly connected drains of the other pair receives the input signal inverted. An output circuit includes a single depletion-type transistor and two enhancement-type transistors connected in a NOR circuit configuration. The gates of the two enhancement-type devices are connected to the source nodes of respective ones of the input circuits. The output signal is produced at the common node of the transistors of the output circuit. All transistors may be N-channel devices.

DESCRIPTION OF THE PREFERRED EMBODIMENTS

Referring now to the schematic diagram of FIG. 3, a preferred embodiment of a pulse generating circuit embodying the present invention will be described. This circuit is formed of N-channel transistors provided on a semiconductor substrate. In the circuit, transistors $Q_{20}$, $Q_{22}$, $Q_{25}$, and $Q_{26}$ are enhancement-type devices, while the transistors $Q_{21}$, $Q_{23}$, and $Q_{24}$ are depletion-type devices. In this circuit, the input signal is A, while a signal $\overline{A}$, namely, the inversion of the signal A, is also provided.

Figure 3:
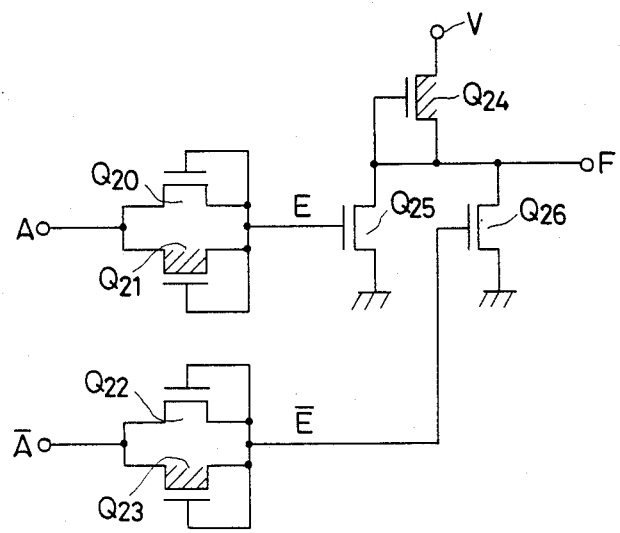
FIG. 3 is a schematic diagram of a pulse generating circuit of the present invention.

The circuit of FIG. 3 includes two input circuits, a first composed of the enhancement/depletion pair of the transistors $Q_{20}$ and $Q_{21}$, and the second of the enhancement/depletion pair of the transistors $Q_{22}$ and $Q_{23}$. In the first input circuit composed of the transistors $Q_{20}$ and $Q_{21}$, the drains of the two transistors are connected together, as are the sources. The drains receive the signal A. The gates of the transistors $Q_{20}$ and $Q_{21}$ are connected to the source node, at which a signal E is produced. The connections among the transistors $Q_{22}$ and $Q_{23}$ of the second input circuit are similar, but the drains receive the signal $\overline{A}$. In this case, a signal $\overline{E}$ is produced. An output circuit is provided by the transistors $Q_{24}$, $Q_{25}$ and $Q_{26}$. These transistors are connected in a NOR gate configuration with the output signal F being produced at the common node.

Importantly, the channel resistances of the enhancement-type transistors $Q_{20}$ and $Q_{22}$ in the on state are significantly less than the on-state resistances of the transistors $Q_{21}$ and $Q_{23}$.

In operation, with reference first to the first input circuit composed of the transistors $Q_{20}$ and $Q_{21}$, when the input signal A changes from L (low level) to H (high level), the enhancement-type transistor $Q_{20}$ will be turned off and the depletion-type transistor $Q_{21}$ turned on. In this case, the gate capacitance of the transistor $Q_{25}$ in the output circuit is charged through the relatively high resistance of the depletion-type transistor $Q_{21}$. On the other hand, when the input signal A changes from H to L, the gate capacitance of the transistor $Q_{25}$ is discharged through the relatively low resistance of the transistor $Q_{20}$ since the transistor 20 is turned on. A similar action happens in the second input circuit composed of the transistors $Q_{22}$ and $Q_{23}$, with the on and off states of the enhancement- and depletion-type transistors being 180° out of phase with respect to the first input circuit.

Figure 4:
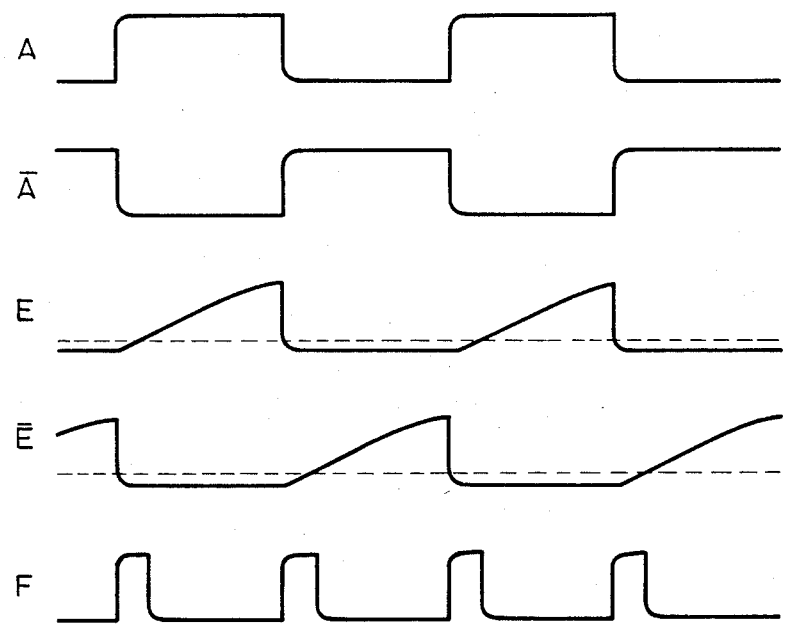
FIG. 4 is a timing chart used to explain the operation of the circuit of FIG. 3.

Because the on-state resistances of the transistors $Q_{21}$ and $Q_{23}$ are significantly greater than those of the transistors $Q_{20}$ and $Q_{22}$, the source-node signals E and $\overline{E}$ of the respective input circuits have significantly slower rise times than fall times, as can clearly be seen in FIG. 4. Accordingly, for the first input circuit, the time from a transition edge of the input signal A until the threshold voltage (indicated by a broken line in FIG. 4) of the transistor $Q_{25}$ is crossed by the signal E is longer for rising-edge transitions of the signal A than for the falling edge transitions. The same is true for the second input circuit with respect to the signals $\overline{E}$ and $\overline{A}$. Therefore, as can be seen from FIG. 4, at a rising-edge transition of the signal A, the signal E remains below the threshold voltage of the transistor $Q_{25}$ for a certain time after the signal $\overline{E}$ has fallen below the threshold level of the transistor $Q_{26}$. Accordingly, a pulse of the output signal F is produced between the time the signal $\overline{E}$ falls to the L level (which occurs rapidly) and the time the signal E crosses the threshold level of the transistor $Q_{25}$. A similar phenomenon occurs for the rising-edge transition of the inverted input signal $\overline{A}$.

Figure 1:
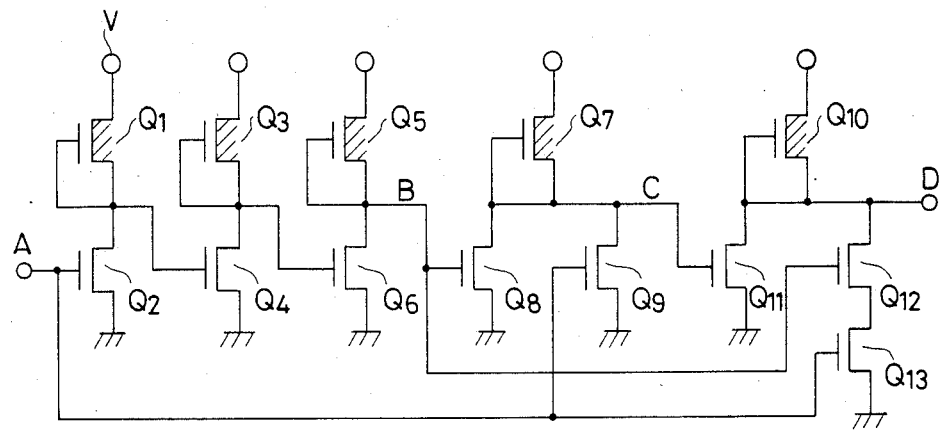
FIG. 1 is a schematic diagram of a conventional pulse generating circuit.
Figure 2:
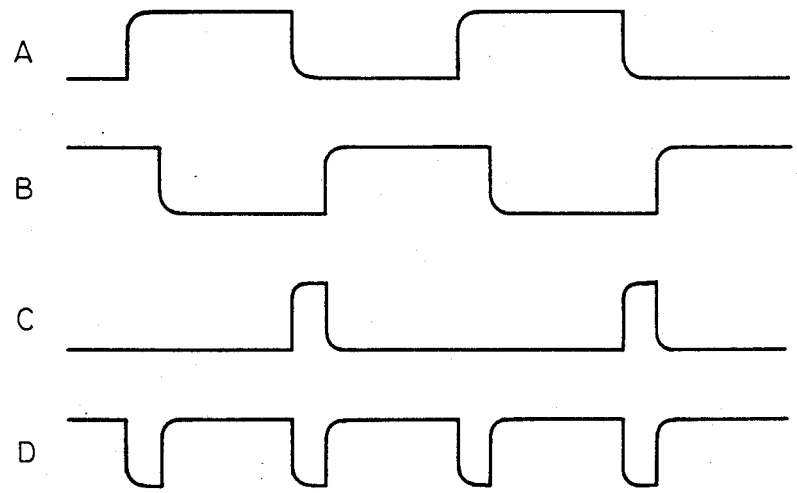
FIG. 2 is a timing chart used to describe the operation of the circuit of FIG. 1.

To change the pulse width of the pulses produced by the circuit of FIG. 3, its suffices merely to change the channel resistances of the depletion-type transistors $Q_{21}$ and $Q_{23}$. That is, it is not necessary to add or subtract transistors or change the basic circuit layout in order to vary the pulse width of the output signal. Also, the circuit of FIG. 3 requires significantly fewer transistor devices than the conventional circuit of FIG. 1. Accordingly, the required chip area and power consumption of the circuit of the invention are significantly reduced with respect to the conventional circuit.

This completes the description of the preferred embodiments of the invention. Although preferred embodiments have been described, it is believed that numerous modifications and alterations thereto would be apparent to one having ordinary skill in the art without departing from the spirit and scope of the invention.

I claim:

1. A pulse generating circuit comprising: at least one input circuit and an output circuit, said input circuit comprising a transistor pair of an enhancement-type transistor and a depletion-type transistor, drain terminals of said enhancement- and depletion-type transistors being coupled to an input terminal, and gate and source terminals of said enhancement- and depletion-type transistors being coupled to a common source node, and said output circuit comprising at least one transistor having a gate coupled to said source node and an output electrode coupled to an output terminal.

2. The pulse generating circuit of claim 1, wherein each of said transistors is an N-channel MOS transistor.

3. The pulse generating circuit as claimed in claim 1, wherein a channel resistance of said depletion-type transistor in an on state thereof is higher than a channel resistance of said enhancement-type transistor in an on state thereof.

4. A pulse generating circuit comprising: first and second input terminals receiving an input signal and an input signal inverted, respectively; first and second input circuits, each of said input circuits comprising an enhancement/depletion transistor pair, a drain of each said enhancement-type transistor and each said depletion-type transistor being coupled commonly to a respective one of said input terminals, and gates and sources of said enhancement- and depletion-type transistors being coupled to a respective common source node; and an output circuit comprising a depletion-type transistor and two enhancement-type transistors connected in a NOR gate configuration with a common node point of said depletion-type transistor and said enhancement-type transistors of said output circuit being coupled to an output terminal, and gates of said enhancement-type transistors of said output circuit being coupled to respective ones of said source nodes.

5. The pulse generating circuit of claim 4, wherein each of said transistors is an N-channel MOS transistor.

6. The pulse generating circuit of claim 4, wherein a channel resistance of said depletion-type transistors of said input circuits in an on state thereof is higher than a channel resistance of said enhancement-type transistors of said input circuits in an on state thereof.

* * * * *